United States Patent
Wilson et al.

(10) Patent No.: US 9,575,599 B1
(45) Date of Patent: Feb. 21, 2017

(54) MULTI-TOUCH GHOST DISCRIMINATION

(71) Applicant: Parade Technologies, Ltd., Santa Clara, CA (US)

(72) Inventors: Cole Wilson, Everett, WA (US); Jonathan R. Peterson, Everett, WA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 162 days.

(21) Appl. No.: 13/628,033

(22) Filed: Sep. 26, 2012

Related U.S. Application Data

(60) Provisional application No. 61/672,707, filed on Jul. 17, 2012.

(51) Int. Cl.
  *G06F 3/044* (2006.01)
  *H05K 1/02* (2006.01)

(52) U.S. Cl.
  CPC ............. *G06F 3/044* (2013.01); *H05K 1/0289* (2013.01)

(58) Field of Classification Search
  CPC G06F 3/041; G06F 2203/041; G06F 3/03547; G06F 3/0412; G06F 3/0414; G06F 3/0416; G06F 3/0418; G06F 3/046; G06F 3/047; G06F 3/0238; G06F 3/018; G06F 1/1662; H05K 9/0073; H05K 9/0079; H05K 9/0081; H05K 9/0088
  USPC .................................................. 345/156–175
  See application file for complete search history.

(56) References Cited

U.S. PATENT DOCUMENTS

| | | | |
|---|---|---|---|
| 7,656,393 B2 | 2/2010 | King et al. | |
| 8,427,541 B2* | 4/2013 | Ono | 348/161 |
| 2008/0150906 A1* | 6/2008 | Grivna | 345/173 |
| 2009/0091551 A1 | 4/2009 | Hotelling et al. | |
| 2010/0001973 A1 | 1/2010 | Hotelling et al. | |
| 2010/0188345 A1* | 7/2010 | Keskin et al. | 345/173 |
| 2011/0157066 A1* | 6/2011 | Waterbury | 345/174 |
| 2011/0248932 A1* | 10/2011 | Wu et al. | 345/173 |
| 2012/0044095 A1 | 2/2012 | Makovetskyy | |
| 2012/0090757 A1 | 4/2012 | Buchan et al. | |
| 2012/0105371 A1 | 5/2012 | Hotelling et al. | |
| 2013/0285972 A1* | 10/2013 | Elias | G06F 3/044 345/174 |

OTHER PUBLICATIONS

Barrett; Putting the "Touch" in multi-touch: An in depth look at the future of interactivity; Document No. 6500478; online: http://www.touchinternational.com/downloads/WhitePages%20for%20Web/PuttingtheTouchinMulti-Touch.pdf; 7 Pages.

(Continued)

*Primary Examiner* — Grant Sitta
(74) *Attorney, Agent, or Firm* — Morgan, Lewis & Bockius LLP

(57) ABSTRACT

An apparatus includes a touch screen panel including a sensing matrix arranged in a row-column format. The apparatus also includes a control device to scan the sensing matrix to detect a presence of multiple objects at least proximate to the touch screen panel. The control device can identify rows and columns of the sensing matrix that correspond to the presence of the multiple objects. The control device can orthogonally multiplex the identified rows and columns into one or more row-column pairs. The control device can scan at least one of the row-column pairs to detect locations of the multiple objects relative to the touch screen panel.

16 Claims, 8 Drawing Sheets

(56) References Cited

OTHER PUBLICATIONS

Barrett et al.; Projected-Capacitive Touch Technology; Information Display, copyright 2010; online: http://www.informationdisplay.org/issues/2010/03/art6/art6.pdf; 6 pages.

* cited by examiner

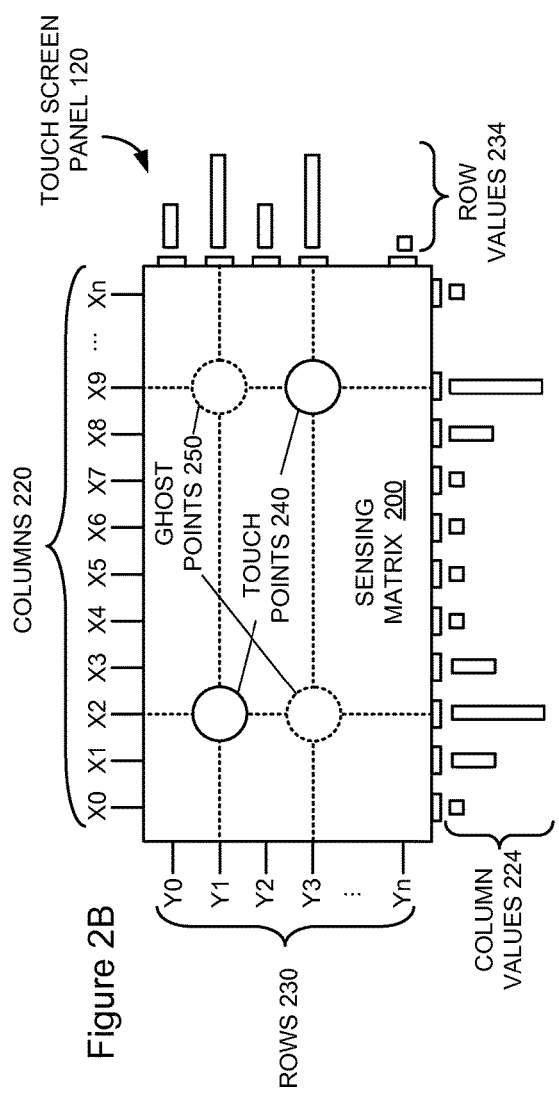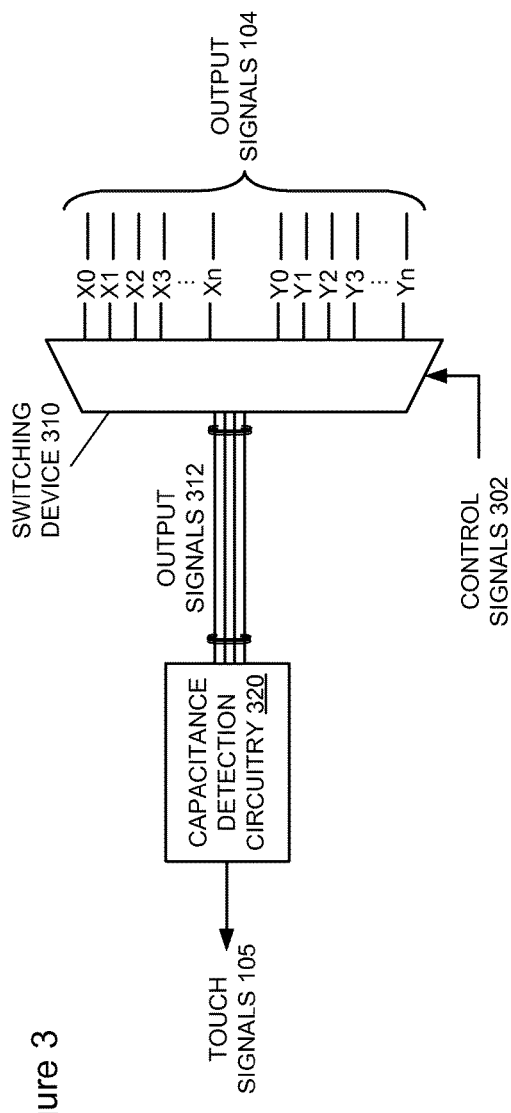

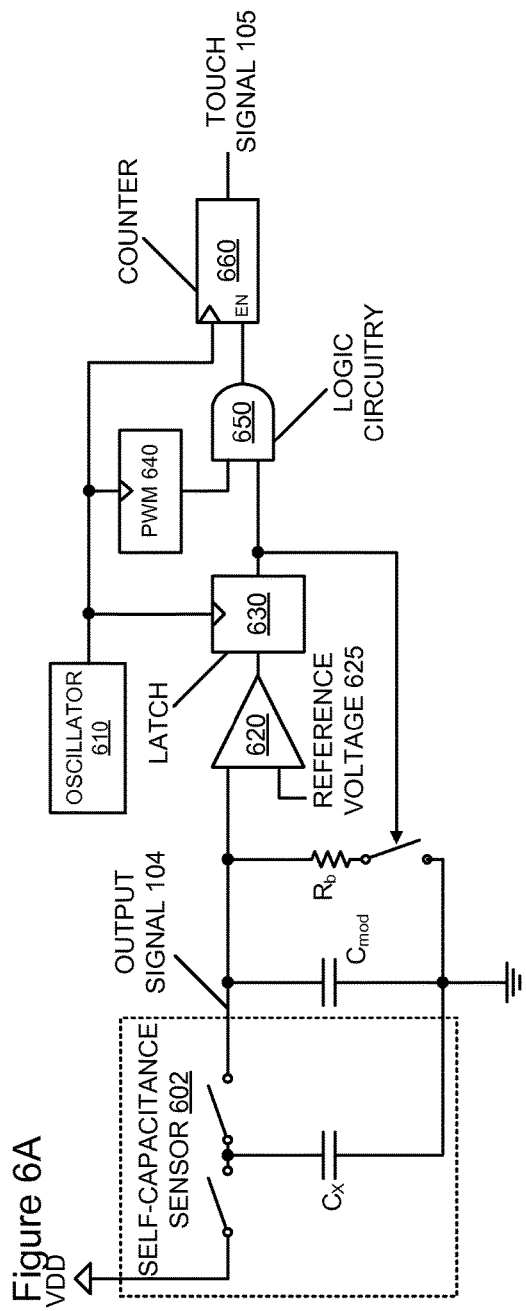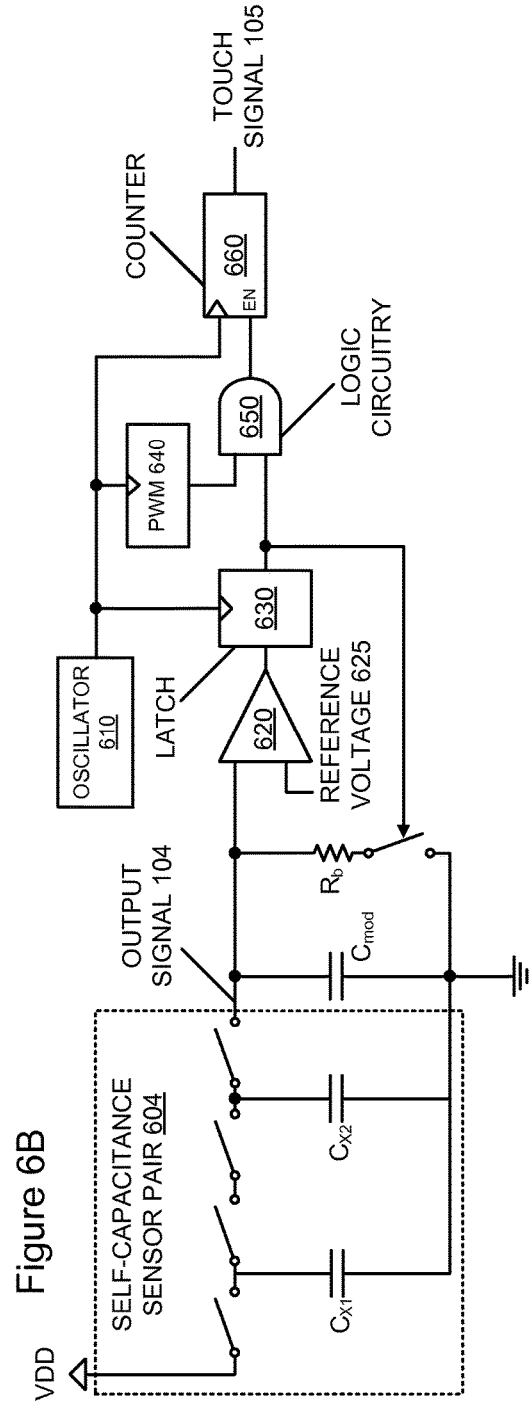
Figure 6A
Figure 6B

MULTI-TOUCH GHOST DISCRIMINATION

RELATED APPLICATIONS

This patent application claims priority to U.S. Provisional Patent Application No. 61/672,707, filed Jul. 17, 2012, all of which is incorporated by reference herein.

TECHNICAL FIELD

This disclosure relates generally to electronic systems, and, more particularly, to distinguishing false touches from actual touches during a multi-touch event of a touch screen panel.

BACKGROUND

Many touch screen devices utilize capacitive touch sensing technology to detect a presence of an object in contact with or proximate to a touch screen panel, for example, by identifying a change in capacitance in the touch screen panel associated with the presence of the object. There are two main types of capacitive touch sensing technology, mutual capacitance and self-capacitance. In mutual capacitive touch screen devices, every row-column intersection in the touch screen panel may include a capacitive sensor that can be separately measured. This all-points-addressable approach to touch screen panels allows for sensing of multiple simultaneous touches to the touch screen panel and for performance of multi-touch operations, such as panning, zooming, rotating, or the like.

In self-capacitance touch screen devices, each row and each column can be separate capacitive sensors. To detect a touch to the touch screen panel, the touch screen device can separately scan each row to determine whether a touch has occurred on a particular row, separately scan each column to determine whether a touch has occurred on a particular column, and then infer a location of the touch based on an intersection of the particular row and the particular column. While self-capacitance can effectively resolve a single touch condition, by addressing rows and columns, as opposed to individual points of the touch screen panel as in mutual capacitance, when there are multiple touches of the touch screen panel, techniques to resolve locations of the multiple touches may provide both locations of actual touches to the touch screen device as well as ghost touches.

DESCRIPTION OF THE DRAWINGS

FIGS. 2A-2C are block diagram examples of a touch screen panel undergoing single touch and multi-touch scans.

FIG. 3 is a block diagram example of portions of a drive interface.

FIGS. 6A and 6B are block diagram examples of portions of the touch screen system capable of ghost point discrimination.

DETAILED DESCRIPTION

An electronic system can include a touch screen panel having a self-capacitance sensing matrix arranged in a row-column format, and include a control device configured to detect a presence of multiple objects at least proximate to the touch screen panel. The control device can scan the sensing matrix to identify rows and columns of the sensing matrix that correspond to the presence of the multiple objects, orthogonally multiplex the identified rows and columns into one or more row-column pairs, and then scan at least one of the row-column pairs to detect locations of the multiple objects relative to the touch screen panel. Embodiments are shown and described below in greater detail.

Figure 1:
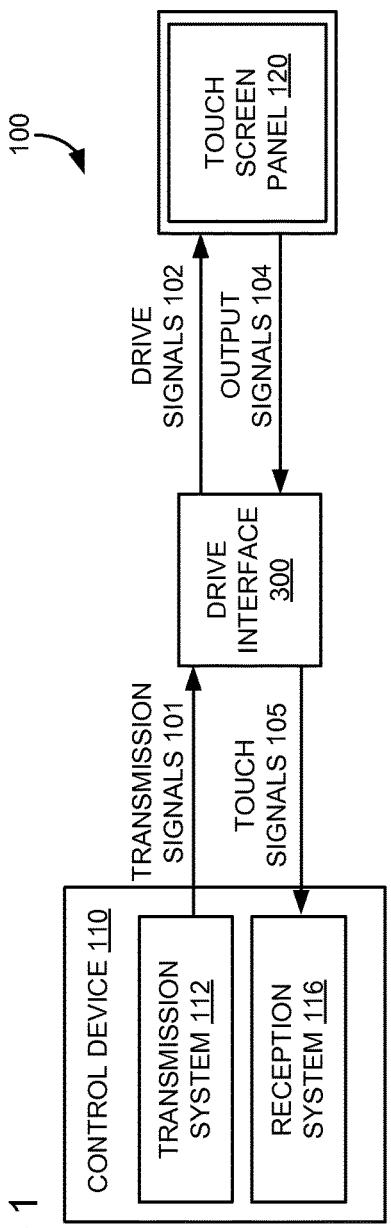
FIG. 1 is a block diagram example of a touch screen system.

FIG. 1 is a block diagram example of a touch screen system 100. Referring to FIG. 1, the touch screen system 100 can include a touch screen panel 120 having sensor elements, for example, disposed as a two-dimensional sensing matrix, to detect touches on a surface of the touch screen panel 120 in response to drive signals 102. Although FIG. 1 shows the touch screen system 100 including a touch screen panel, in some embodiments, the touch screen system 100 can include other input surfaces, such as track pads or other screen-less surfaces. The touches on the surface of the touch screen panel 120 can be an object, such as a stylus, finger, palm, cheek, ear, or the like, in contact with or proximate to the touch screen panel. In some embodiments, the two-dimensional sensing matrix can be a self-capacitive sensing matrix having one capacitive sensor per row and one capacitive sensor per column.

The touch screen system 100 can include a control device 110 to control sensing operations associated with a touch screen panel 120. The control device 110 can include a transmission system 112 to generate transmission signals 101 and provide them to a drive interface 300. The drive interface 300 can generate the drive signals 102 from the transmission signals 101 and provide the drive signals 102 to the touch screen panel 120. In some embodiments, the drive signals 102 can be periodic, for example, to allow for multiple scan intervals for the touch screen panel 120.

The touch screen panel 120 can receive the drive signals 102 from the drive interface 300 and apply them to particular rows and columns. The touch screen panel 120 can provide output signals 104 to the drive interface 300. The output signals 104 can identify whether a touch occurred on a particular row or a particular column. For example, when the touch screen panel 120 includes self-capacitive sensor elements, a touch of the surface of the touch screen panel 120 can alter a capacitance of a row or a column associated with the touch.

The drive interface 300 can generate touch signals 105 from the output signals 104 and provide them to the reception system 116. In some embodiments, the drive interface 300 can convert a current or voltage from an output of a row or a column of the touch screen panel 120 into the touch signals 105, which can identify a capacitance of the row or column in the touch screen panel 120.

The reception system 116 can analyze the touch signals 105 to determine whether the surface of the touch screen panel 120 was touched, for example, in contact with or proximate to an object. In some embodiments, the reception system 116 can identify the capacitance associated with rows and columns from the touch signals 105. Based on the row and column capacitances, the reception system 116 can infer a location of a touch corresponds to an intersection of a row and a column having capacitance measurements indicating that a touch occurred on the row and on the column. In some embodiments, the output signals 104 can identify capacitances on multiple rows and/or multiple columns, which indicates multiple touches have occurred on the touch screen panel 120. Since the intersections between the multiple rows and/or multiple columns can identify locations of actual touches and also one or more ghost points, the control device 110 can perform an additional scan to discriminate ghost points from actual touches of the touch screen panel 120. A ghost point can be a location on the touch screen panel 120 corresponding to an intersection between a row and a column, both having capacitances indicating a touch has occurred on the row and column, when an actual touch has not occurred at the location.

In some embodiments, the control device 110 can prompt generation of super-sensors, for example, by electrically coupling a row and a column, both having capacitances indicating a touch has occurred on the row and column, into a row-column pair, and then scan the row-column pair to determine a capacitance of the row-column pair. The reception system 116 can distinguish between an actual touch and a ghost point based, at least in part, on the capacitance of the row-column pair, and thus determine whether the intersection of the row and column in the row-column pair corresponds to an actual touch or a ghost point. Embodiments of the ghost point discrimination will be described below in greater detail.

Figure 2A:
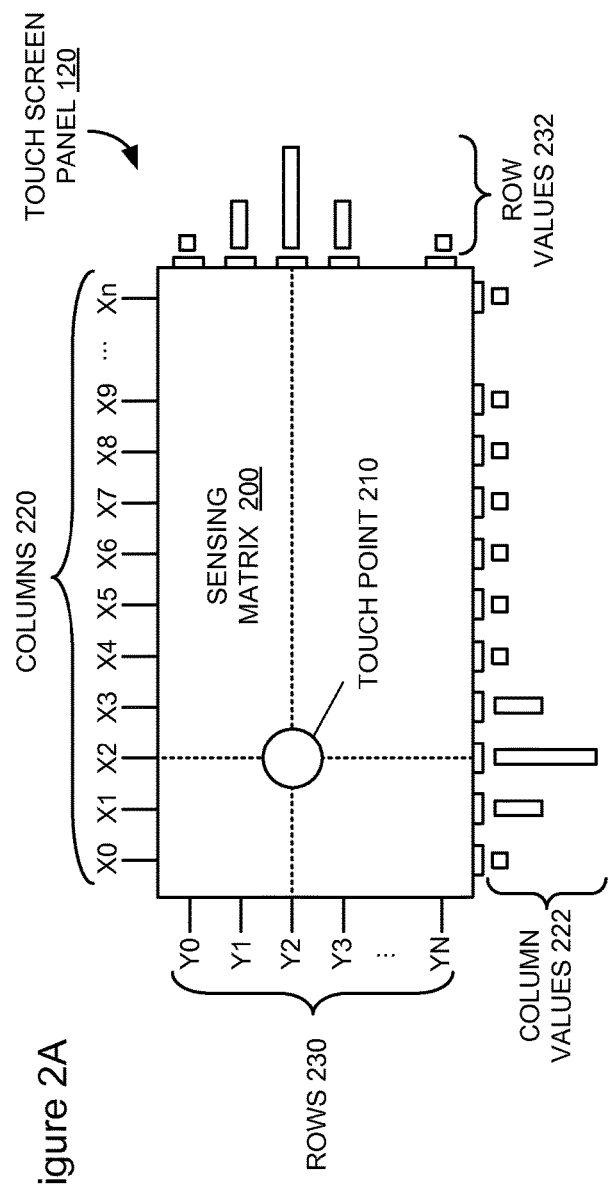
Figure 2C:
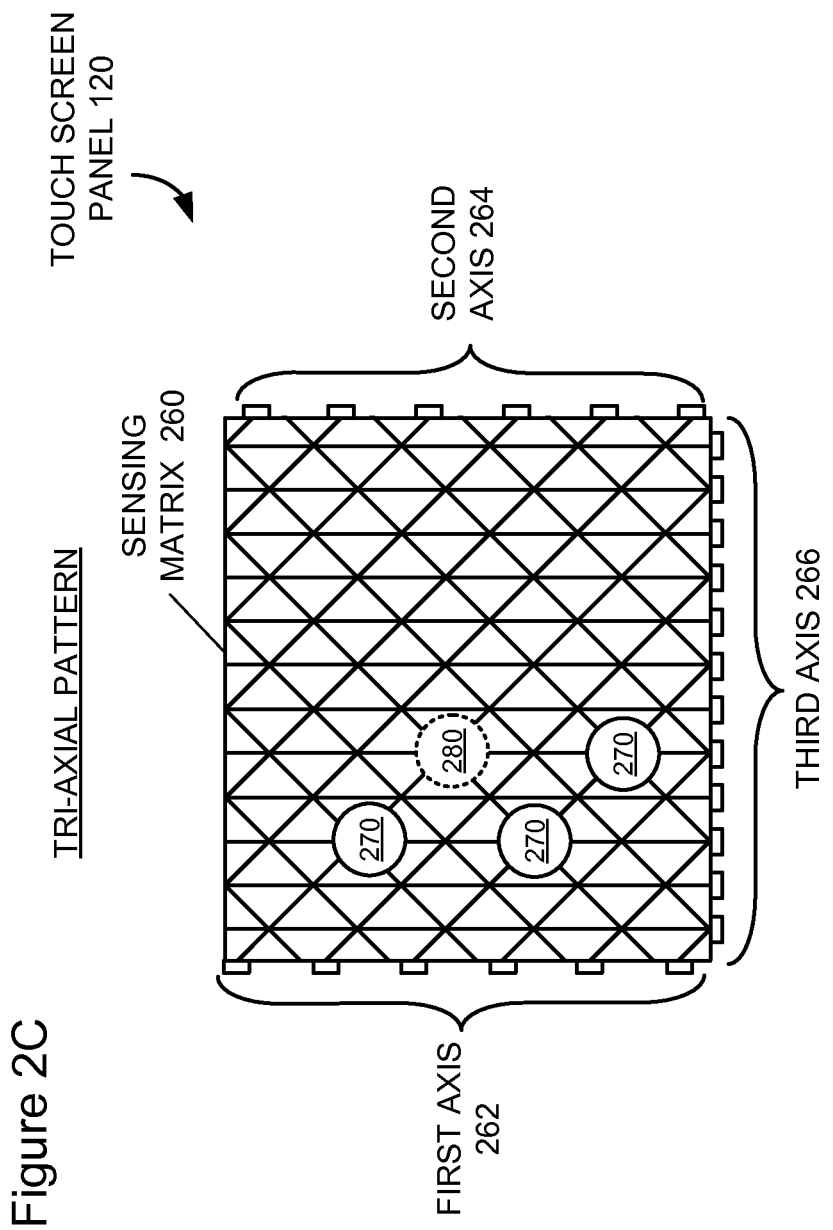

FIGS. 2A-2C are block diagram examples of the touch screen panel 120 undergoing single touch and multi-touch scans. Referring to FIG. 2A, the touch screen panel 120 can have a sensing matrix 200 arranged in a row-column format, for example, with columns X0-Xn and rows Y0-Yn. When an object touches the touch screen panel 120 either in contact with the touch screen panel 120 or coming proximate to the touch screen panel 120, a capacitance of at least one row and at least one column in the touch screen panel 120 can be altered.

For example, FIG. 2A shows a touch point 210 corresponding to (X2, Y2) and the column values 222 and row values 232 acquired in response to a scan of the touch screen panel 120 indicate elevated capacitance magnitudes on column X2 and row Y2. The control device 110 and drive interface 300 can utilize the column values 222 and row values 232 corresponding to the capacitance magnitudes to infer that the location of the touch point 210 lies at the intersection of column X2 and row Y2.

Referring to FIG. 2B, in a first scan of the touch screen panel 120, the column values 224 and row values 234 indicate that there are multiple touch points 240 on the touch screen panel 120. For example, the column values 224 can indicate columns X2 and X9 correspond to at least one touch point and row values 234 can indicate columns Y1 and Y3 correspond to at least one touch point. In some embodiments, the first scan can individually scan each row and each column to determine a capacitance associated with each row and each column.

To resolve locations of touch points 240, the control device 110 can identify the intersections between the rows and the columns that correspond to at least one touch point, for example, intersections (X2, Y1), (X2, Y3), (X9, Y1), and (X9, Y3). Since, based on the information from the first scan, the control device 110 can infer that there are between two and four touch points 240 on the touch screen panel 120, the control device 110 can perform a ghost discrimination procedure to determine a quantity and a location of the touch points 240.

The ghost discrimination procedure includes orthogonally multiplexing the rows and the columns that correspond to at least one touch point to create row-column pairs, such as (X2, Y1), (X2, Y3), (X9, Y1), and (X9, Y3), and then performing a second scan of the row-column pairs to determine combined row-column values for the scanned row-column pairs. Since the measured change in capacitance values for touch points 240 of the row column pairs are lower than capacitance values for ghost points 250, the reception system 116 can determine which of the intersections (X2, Y1), (X2, Y3), (X9, Y1), and (X9, Y3) corresponding to locations of the touch points 240 and locations of the ghost points 250. Embodiments of the second scan of the row-column pairs will be described below in greater detail.

In some embodiments, the ghost discrimination procedure can generate row-column pairs that electrically couple multiple rows and/or multiple columns together. The ghost discrimination procedure, in some instances, does not have to generate row-column pair from every possible combination of rows and columns identified as corresponding to a touch point 240 or ghost point 250 in the first scan. For example, the ghost discrimination procedure can generate one row-column pair and determine in the second scan that the row-column pair corresponds to a touch point 240 or a ghost point 250. Based on this information and symmetry between ghost points 250 and touch points 240, the control device 110 can infer the locations of at least some of the touch points 240.

In some embodiments, the control device 110 can generate subsequent row-column pairs based on the results of the first scan and the results of the second scan due to the symmetry between ghost points 250 and touch points 240. For example, when the control device 110 determines row-column pair (X2, Y1) corresponds to a touch point 240, the control device 110 can guess a second touch point will be found at intersection (X9, Y3). The control device 110, in some embodiments, can perform the ghost discrimination procedure until an identification of two touch points 240 has been made and then cease looking for additional touch points.

Although FIGS. 2A and 2B show the first scan determines capacitance values for each row and each column in the touch screen panel 120, in some embodiments, the control device 110 can perform any number of first scans to determine capacitances of the rows and columns. For example, the control device 110 can implement a diagonal paired first scan, which generates row-column pairs diagonally over the touch screen panel 120, such as at points (X1, Y1), (X2, Y2), (X3, Y3) to (Xn, Yn), so that each row and each column can be represented in at least one of the row-column pairs. The reception system 116 can analyze the capacitance information from the diagonal paired first scan to identify rows and columns that correspond to a touch point 210 or 240. The control device 110 can generate new row-column pairs with the identified rows and columns, and can implement the second scan with the new row-column pairs.

Referring to FIG. 2C, the touch screen panel 120 can have a sensing matrix 260 arranged in a tri-axial pattern, for example, with three sensing axes. When an object touches the touch screen panel 120 either in contact with the touch screen panel 120 or coming proximate to the touch screen panel 120, a capacitance of at least one sensing line in a first axis 262, at least one sensing line in a second axis 264, and at least one sensing line in a third axis 266 in the touch screen panel 120 can be altered.

For example, FIG. 2C shows three touch points 270. In a first scan of the touch screen panel 120, elevated capacitance magnitudes of sensing lines on all three axes 262, 264, and 266 can allow the control device 110 and drive interface 300 to infer the locations of the touch points 270 on the touch screen panel 120.

Since, based on the information from the first scan, the control device 110 can infer that there are at least three touch points 270 on the touch screen panel 120, the control device 110 can perform a ghost discrimination procedure to determine a quantity and a location of the touch points 270.

The ghost discrimination procedure includes orthogonally multiplexing the at least two sensing lines from the three axes 262, 264, and 264 to create row-column pairs and then performing a second scan of the row-column pairs to determine combined row-column values for the scanned row-column pairs. The row-column pairs can include at least two sensing lines from the three axes 262, 264, and 266 of sensing lines. Since the measured change in capacitance values for touch points 270 of the row-column pairs are lower than capacitance values for a ghost point 280, the reception system 116 can determine locations of the touch points 270 and a location of the ghost point 280. Embodiments of the second scan of the row-column pairs will be described below in greater detail. FIG. 3 is a block diagram example of portions of the drive interface 300 of FIG. 1. Referring to FIG. 3, the drive interface 300 can include a switching device 310 to receive the output signals 104 from the touch screen panel 120 of FIG. 1. The switching device 310 can pass the output signals 104 through to capacitance detection circuitry 320 as output signals 312, for example, during an initial scan of the touch screen panel 120. The switching device 310 also can orthogonally multiplex or electrically couple some of the output signals 104 together to generate at least some of the output signals 312, for example, in a ghost discrimination scan of the touch screen panel 120. In some embodiments, the switching device 310 can pass or electrically couple the output signals 104 in response to control signals 302, for example, from the control device 110 of FIG. 1.

The capacitance detection circuitry 320 can convert the output signals 312 into touch signals 105. For example, each output signal 104 or 312 can provide a current or a voltage having a magnitude that corresponds to a capacitance value of a row, a column, or a row-column pair. The capacitance detection circuitry 320 can convert the currents or voltages from the output signals 312 into touch signals 105, which can represent the capacitance values of rows, columns, and row-column pairs differently, for example, as a count value or as a duty cycle of the touch signals 105. Examples of various conversion techniques will be described below in greater detail.

Figure 4A:
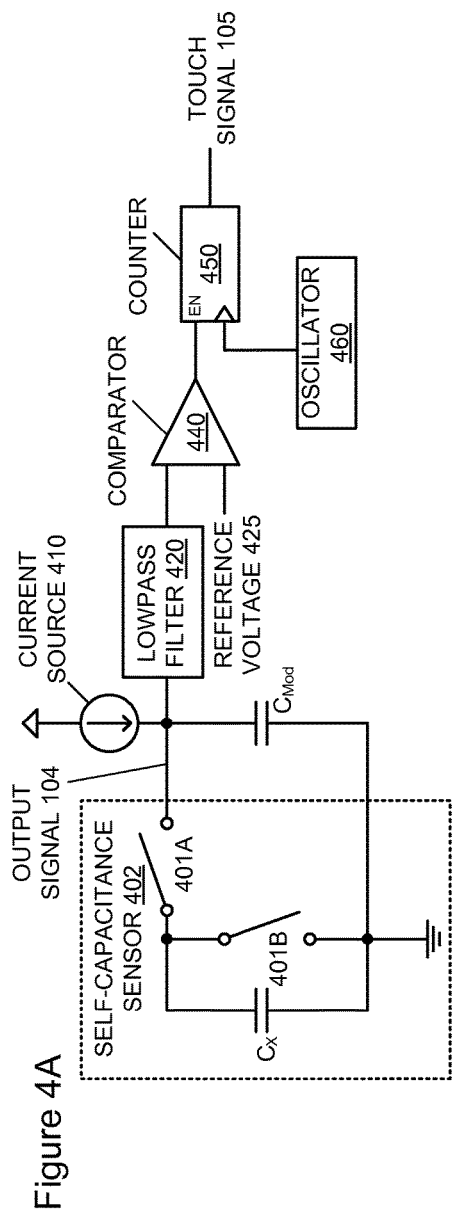
FIGS. 4A and 4B are block diagram examples of portions of the touch screen system capable of ghost point discrimination.
Figure 4B:
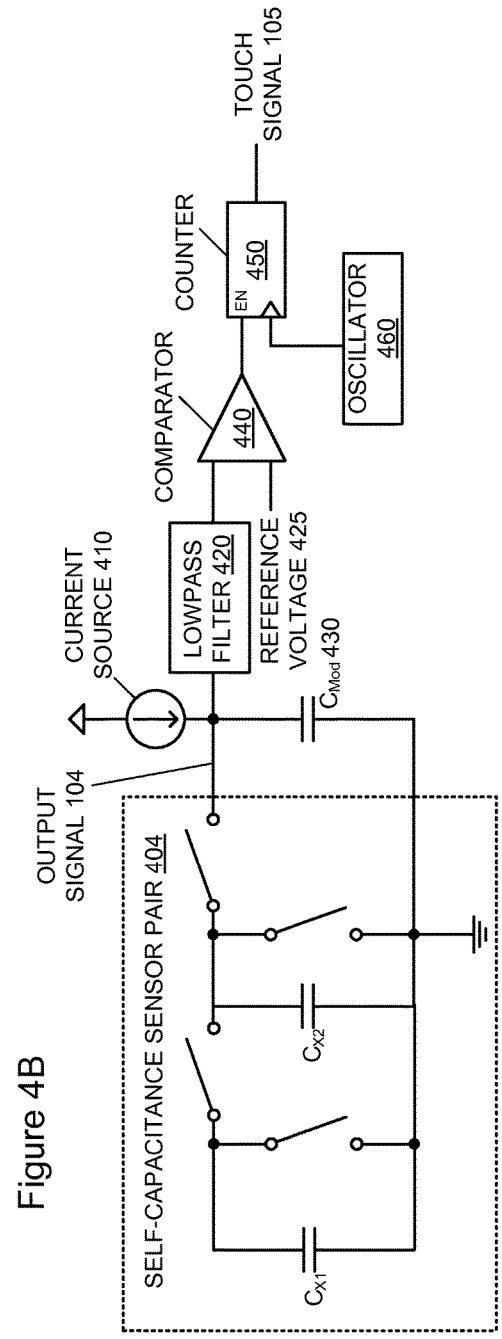

FIGS. 4A and 4B are block diagram examples of portions of the touch screen system 100 capable of ghost point discrimination. Referring to FIG. 4A, a self-capacitance sensor 402, such as a row or column of the touch screen panel 120, includes a sense capacitor Cx and a pair of switches 401A and 401B. The self-capacitance sensor 402 can generate an output signal 104 with a voltage having a magnitude that corresponds to a capacitance value corresponding to the sense capacitor Cx. Since a touch of the touch screen panel 120 corresponding to the sense capacitor Cx can increase the capacitance value of the sense capacitor Cx, the magnitude of the voltage in the output signal 104 can be lower when there is touch corresponding to the sense capacitor Cx.

During a scan of the touch screen panel 120, a current source 410 can be activated to provide a preset level of current capable of charging a modulation capacitor Cmod and elevating a voltage level of the output signal 104. The output signals 104 can be filtered, for example, by a lowpass filter 420, and then a comparator 440 can compare the voltage level of the output signal 104 to a reference voltage 425. In some embodiments, when the output signals 104 is less than the reference voltage 425, the output of the comparator 440 can enable a counter 450 to initiate counting a number of cycles generated by an oscillator 460. The counter 450 can output a count value as the touch signal 105.

When there is no touch of the self-capacitance sensor 402, the voltage level of the output signal 104 can be slightly below a voltage level of the reference voltage 425. Thus, once the current source 410 becomes active and starts charging the modulation capacitor Cmod, the voltage level of the output signal 104 can rise above the reference voltage 425 after a relatively few counts being recorded. The counter 450 can output the touch signal 105 with a relatively low count value.

When there is a touch of the self-capacitance sensor 402, the voltage level of the output signal 104 can be below the voltage level of the output signal 104 when there is no touch. Thus, once the current source 410 becomes active and starts charging the modulation capacitor Cmod, the voltage level of the output signal 104 can rise above the reference voltage 425, but over a longer period of time than when there is no touch of the self-capacitance sensor 402. The counter 450 can output the touch signal 105 with a higher count value than when there is no touch of the self-capacitance sensor 402.

FIG. 4B includes a self-capacitance sensor pair 404, shown as an electrically coupled pair of self-capacitance sensors, such as a row and a column electrically coupled. The self-capacitance sensor pair 404 can include a pair of sense capacitors Cx1 and Cx2 electrically coupled in parallel.

When the self-capacitance sensor pair 404 corresponds to a location of an actual touch of the touch screen panel 120, the voltage level of the output signal 104 can be based on the capacitances of the parallel sense capacitors Cx1 and Cx2, which includes additional capacitance due to one object touching the pair of sense capacitors Cx1 and Cx2. Thus, once the current source 410 becomes active and starts charging the modulation capacitor Cmod 430, the voltage level of the output signal 104 through the lowpass filter 440 can be detected by the comparator 440 to rise above the reference voltage 425. The counter 450, responsive to an enable signal from the comparator, can output the touch signal 105 as a first count value representing the number of cycles generated by the oscillator 460.

When the self-capacitance sensor pair 404 corresponds to a location of a ghost point, the voltage level of the output signal 104 can be based on the capacitances of the parallel sense capacitors Cx1 and Cx2, which includes additional capacitance due to multiple objects touching the pair of sense capacitors Cx1 and Cx2. Since multiple objects can inject more capacitance into the self-capacitance sensor pair 404 than a single object, the voltage level of the self-capacitance sensor pair 404 corresponding to the ghost point can be lower than the voltage level of the self-capacitance sensor pair 404 corresponding to an actual touch. Once the current source 410 becomes active, the voltage level of the output signal 104 can rise above the reference voltage 425, but over a longer period of time than when the self-capacitance sensor pair 404 corresponds to an actual touch. The counter 450 can output the touch signal 105 with a second count value higher than the first count value corresponding to an actual touch of the self-capacitance sensor pair 404.

Figure 5:
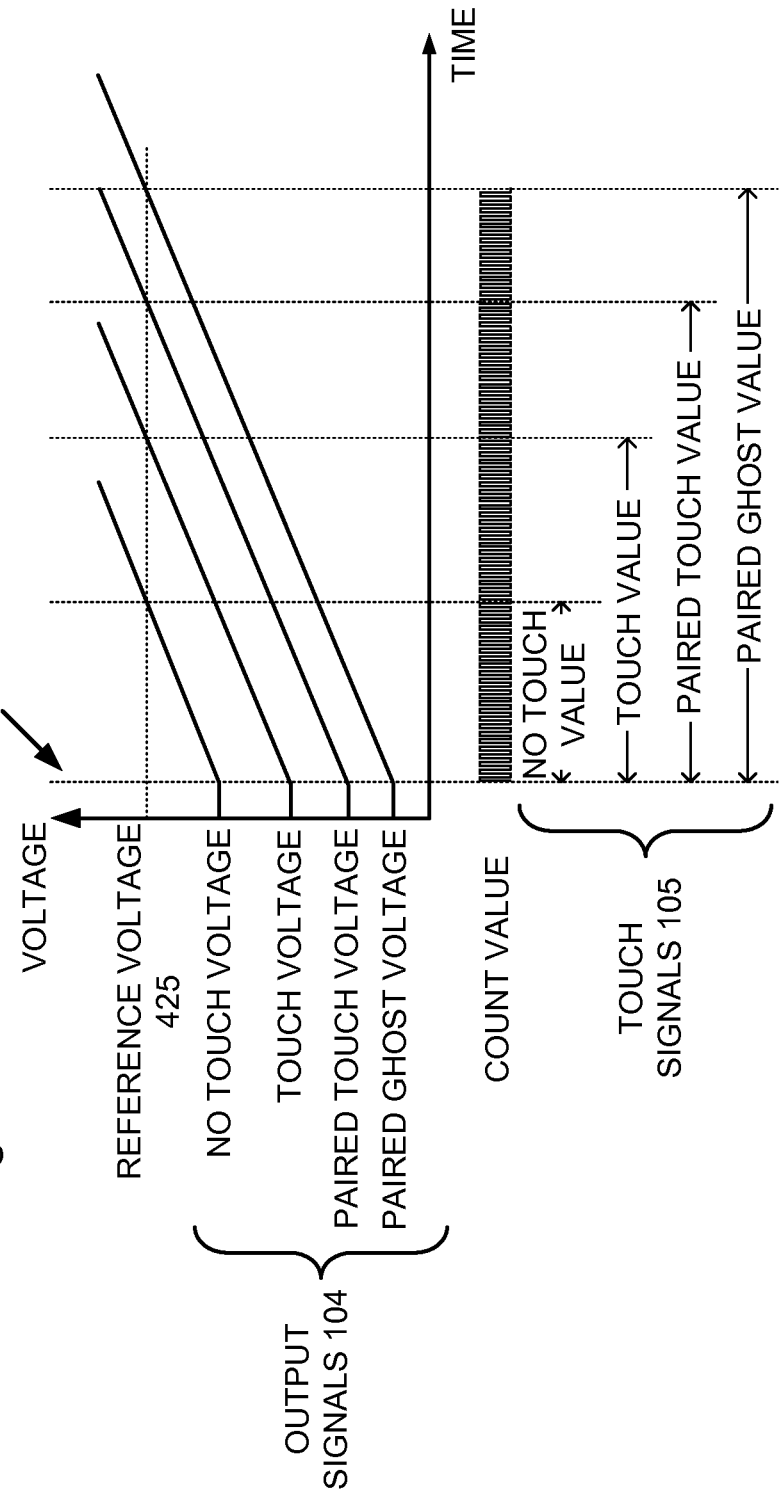
FIG. 5 is an example graph illustrating ghost point discrimination shown in FIGS. 4A and 4B.

FIG. 5 is an example graph illustrating ghost point discrimination discussed with respect to FIGS. 4A and 4B. Referring to FIG. 5, the graph shows voltage levels of output signals 104 over time for various touch conditions and system configurations. For example, a no touch voltage line and a touch voltage line correspond to a scan of an unpaired sense capacitor, such as self-capacitance sensor 402 of FIG. 4A, while a paired touch voltage line and a paired ghost voltage line correspond to a scan of a paired sense capacitor, such as self-capacitance sensor pair 404 of FIG. 4B. Each of the different voltage lines (no touch voltage, touch voltage, paired touch voltage, and paired ghost voltage) start at a different voltage level, which can correspond to a capacitance level in the sense capacitor or sense capacitor pair, respectively. After a current source is activated, the voltage lines show increases in the voltage levels through a voltage level of a reference voltage 425. The touch signals 105 can have count values corresponding to a time that elapses for each voltage line to rise from an initial voltage level to the reference voltage 425.

FIGS. 6A and 6B are block diagram examples of portions of a control device (e.g., the control device 110 of FIG. 1) capable of ghost point discrimination. Referring to FIG. 6A, a self-capacitance sensor 602, such as a row or column of the touch screen panel 120 of FIG. 1, includes a sense capacitor Cx and a pair of switches. During a scan of the touch screen panel 120, the self-capacitance sensor 602 can generate an output signal 104 with a current having a magnitude that corresponds to a capacitance value of the sense capacitor Cx. Since a touch of the touch screen panel 120 corresponding to the sense capacitor Cx can increase the capacitance value of the sense capacitor Cx, the magnitude of the current in the output signal 104 can increase.

The current in the output signal 104 can charge a modulation capacitor Cmod, elevating a voltage level received by a comparator 620. The comparator 620 can compare the voltage level corresponding to the modulation capacitor Cmod with a reference voltage 625 and provide an output to a latch 630, which captures the output in response to a signal from an oscillator 610. The value stored in the latch 630 can be utilized to enable a counter 660 via logic circuitry 650 that can perform an AND operation with a pulse width modulator 640. The counter 660 can generate the touch signal 105 in response to being enabled by the logic circuitry 650 and the signal from the oscillator 610.

The value stored in the latch 630 also can be utilized to engage or disengage a bleed resistor Rb, for example, via a switch. The bleed resistor Rb can discharge the modulation capacitor Cmod. The timing between the charging and discharging of the modulation capacitor Cmod corresponds to a duty cycle of the touch signal 105. Since the charging time of the modulation capacitor Cmod corresponds to the magnitude of the current through the self-capacitance sensor 602, the duty cycle of the touch signal 105 can indicate a magnitude of capacitance in the self-capacitance sensor 602.

When there is no touch of the self-capacitance sensor 602, a magnitude of the current of the output signal 104 can be below a magnitude of the current of the output signal 104 when there is a touch of the self-capacitance sensor 602. Since the modulation capacitor Cmod can charge more slowly when there is no touch of the of the self-capacitance sensor 602, the duty cycle of the touch signal 105 can be lower than when there is a touch of the of the self-capacitance sensor 602 compared to when there is no touch of the self-capacitance sensor 602.

FIG. 6B operates similarly to FIG. 6A except the self-capacitance sensor 602 of FIG. 6A has been replaced with a self-capacitance sensor pair 604, shown as an electrically coupled pair of self-capacitance sensors, such as a row and a column electrically coupled. The self-capacitance sensor pair 604 can include a pair of sense capacitors Cx1 and Cx2 electrically coupled in parallel.

When the self-capacitance sensor pair 604 corresponds to a location of an actual touch of the touch screen panel 120, the magnitude of current of the output signal 104 can be based on the capacitances of the parallel sense capacitors Cx1 and Cx2, which includes additional capacitance due to one object touching the pair of sense capacitors Cx1 and Cx2. When the self-capacitance sensor pair 604 corresponds to a location of a ghost point, the magnitude of current of the output signal 104 can be based on the capacitances of the parallel sense capacitors Cx1 and Cx2, which includes additional capacitance due to multiple objects touching the pair of sense capacitors Cx1 and Cx2.

Since multiple objects can inject more capacitance into the self-capacitance sensor pair 604 than a single object, the magnitude of current of the self-capacitance sensor pair 604 corresponding to the ghost point can be higher than the magnitude of current of the self-capacitance sensor pair 604 corresponding to an actual touch. Since the modulation capacitor Cmod can charge more slowly when there is less current, the duty cycle of the touch signal 105 can be greater than when the self-capacitance sensor pair 604 corresponds to a location of a ghost point compared to when the self-capacitance sensor pair 604 corresponds to a location of an actual touch of the touch screen panel 120.

Figure 7A:
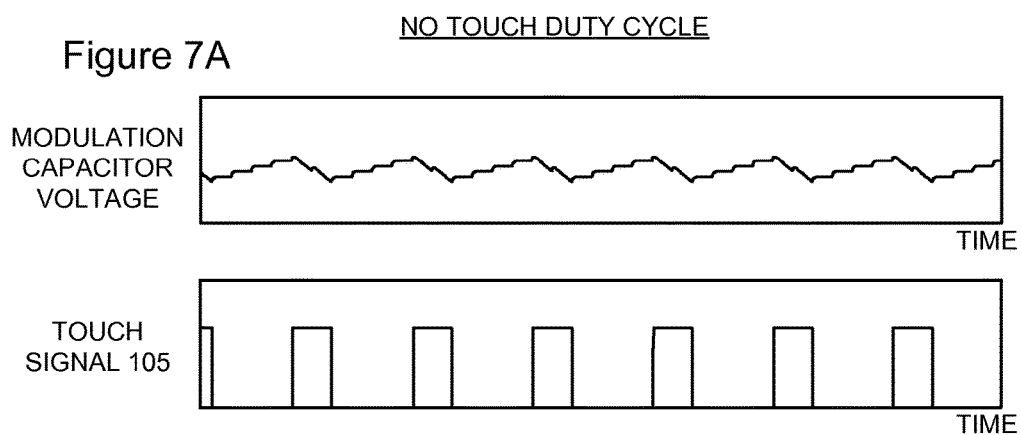
FIGS. 7A-7C are example graphs illustrating ghost point discrimination described with respect to FIGS. 6A and 6B.
Figure 7B:
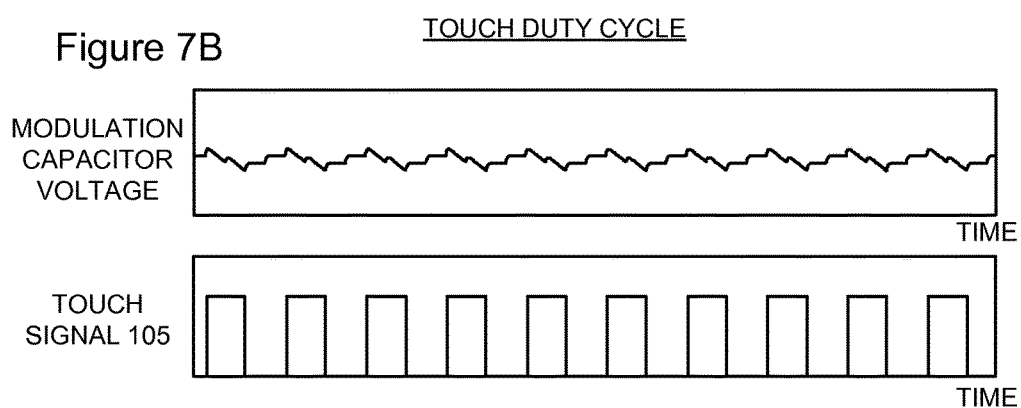
Figure 7C:
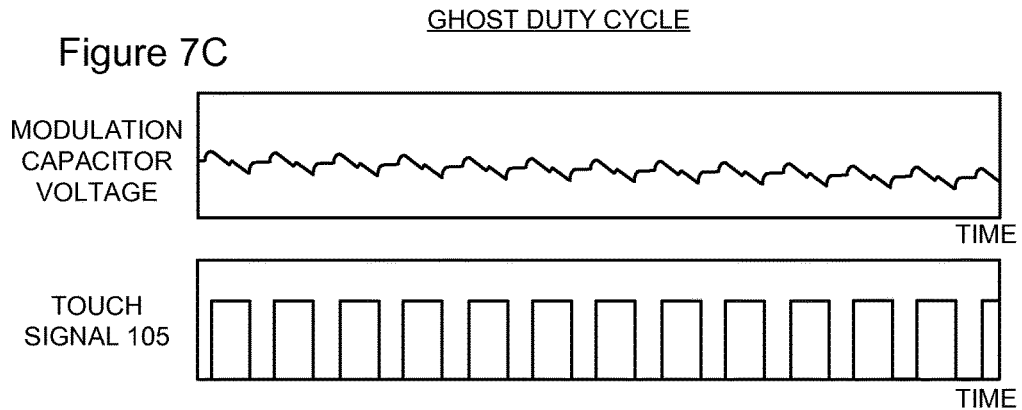

FIGS. 7A-7C are example graphs illustrating waveforms used in ghost point discrimination as described with respect to FIGS. 6A and 6B. Referring to FIGS. 7A-7C, the graphs show voltage waveforms of the modulation capacitor Cmod over time and of the touch signal 105 over time. For example, the voltage waveform of the modulation capacitor Cmod in FIG. 7A shows the slowest charging time, resulting in the smallest duty cycle of the touch signal 105, while the voltage waveform of the modulation capacitor Cmod in FIG. 7C shows the fastest charging time, resulting in the largest duty cycle of the touch signal 105. Since the modulation capacitor Cmod can charge more slowly when there is less current, the duty cycle of the touch signal 105 can be higher than when the self-capacitance sensor pair 604 corresponds to a location of a ghost point compared to when the self-capacitance sensor pair 604 corresponds to a location of an actual touch of the touch screen panel 120.

Figure 8:
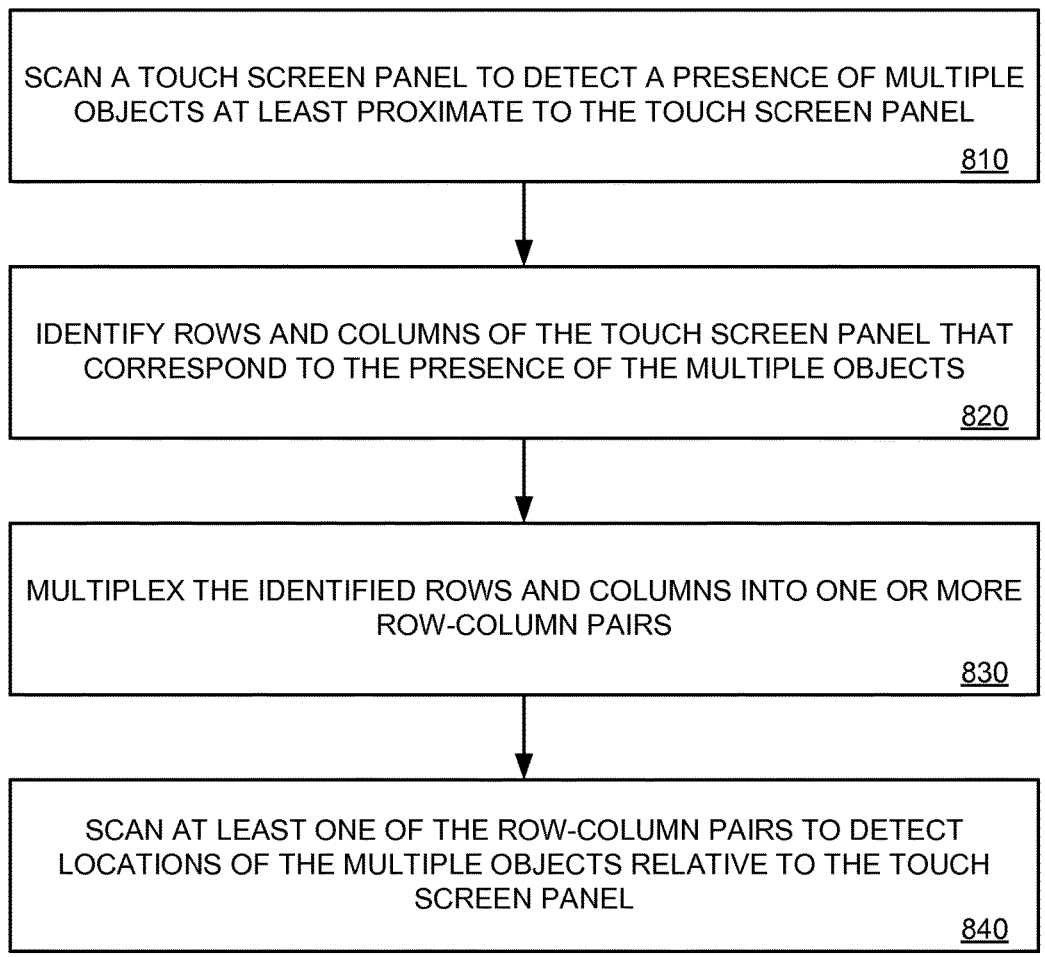
FIG. 8 is an example operational flowchart for ghost point discrimination.

FIG. 8 is an example operational flowchart for ghost point discrimination. Referring to FIG. 8, at a block 810, a control device can scan a touch screen panel to detect a presence of multiple objects at least proximate to the touch screen panel. The scan of the touch screen panel can be performed to detect a capacitance value for each row and each column of the touch screen panel. In some embodiments, rather than performing a row-by-row and column-by-column scan, the control device can perform a diagonal paired scan of rows and columns of the touch screen panel, where each row and column can be included in at least of the row-column pairs scanned.

At a block 820, the control device can identify rows and columns of the touch screen panel that correspond to the presence of the multiple objects. In some embodiments, the control device can review the capacitance levels of the rows and column obtained through the scan and determine which of the rows and columns correspond to the presence of at least one of the multiple objects.

At a block 830, the control device can multiplex the identified rows and columns into one or more row-column pairs. In some embodiments, each row-column pair can include one of the identified rows and one of the identified columns, while in other embodiments multiple rows and/or columns can be multiplexed together to for the row-column pairs.

At a block 840, the control device can scan at least one of the row-column pairs to detect locations of the multiple objects relative to the touch screen panel. Since the capacitance value of a multiplexed row-column pair corresponding to one of the multiple objects can have a different capacitance value than a multiplexed row-column pair corresponding to a ghost point, the control device can distinguish between ghost points and locations corresponding to the multiple objects based on the results of the scan of the row-column pairs.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. An apparatus comprising:
 a touch screen panel including a sensing matrix arranged in a row-column format; and
 a control device configured to:
  scan the sensing matrix including a plurality of rows and a plurality of columns to detect presence of multiple objects at least proximate to the touch screen panel, including measuring a respective self-capacitance of each of the plurality of rows and each of the plurality of columns;
  in accordance with the measured self-capacitances of the plurality of rows and the plurality of columns, identify a subset of rows and a subset of columns of the sensing matrix that correspond to the presence of the multiple objects;
  identify a plurality of sensor pairs, wherein each sensor pair includes two sensors, each selected from either the subset of identified rows or the subset of identified columns; and
  scan the plurality of sensor pairs to determine a plurality of combined self-capacitance values that are used to detect locations of the multiple objects relative to the touch screen panel, including: for each of the plurality of sensor pairs, electrically coupling, by the control device, the two sensors of the respective sensor pair in parallel and measuring a respective magnitude of combined self-capacitance for the two sensors of the respective sensor pair.

2. The apparatus of claim 1, wherein each sensor pair includes one row and one column, the intersection of which corresponds to a location of one of the multiple objects relative to the touch screen panel or a location of a ghost point.

3. The apparatus of claim 1, wherein the control device is configured to detect a location of a ghost point on the touch screen panel based on the scan of the plurality of sensor pairs.

4. The apparatus of claim 1, wherein the control device is configured to identify the rows and the columns of the sensing matrix that correspond to the presence of the multiple objects based on capacitances corresponding to the rows and the columns of the sensing matrix.

5. The apparatus of claim 1, wherein the control device is configured to identify a capacitance of each scanned sensor pair and to detect locations of the multiple objects relative to the touch screen panel based on magnitudes of the capacitances corresponding to the scanned sensor pairs, wherein a sensor pair corresponding to a ghost point on the touch screen panel has a larger capacitance than a sensor pair corresponding to one of the locations of the multiple objects relative to the touch screen panel.

6. A method comprising:
sensing, by a control device, a sensing matrix of a touch screen panel that includes a plurality of rows and a plurality of columns to detect presence of multiple objects at least proximate to the touch screen panel, including measuring a respective self-capacitance of each of the plurality of rows and each of the plurality of columns;
in accordance with the measured self-capacitances of the plurality of rows and the plurality of columns, identifying, by the control device, a subset of rows and a subset of columns of the touch screen panel that correspond to the presence of the multiple objects;
identifying a plurality of sensor pairs, wherein each sensor pair includes two sensors, each selected from either the subset of identified rows or the subset of identified columns;
and
sensing, by the control device, the plurality of sensor pairs to determine a plurality of combined self-capacitance values that are used to detect locations of the multiple objects relative to the touch screen panel, including: for each of the plurality of sensor pairs, electrically coupling, by the control device, the two sensors of the respective sensor pair in parallel and measuring a respective magnitude of combined self-capacitance for the two sensors of the respective sensor pair.

7. The method of claim 6, wherein each sensor pair includes one row and one column, the intersection of which corresponds to a location of one of the multiple objects relative to the touch screen panel or a location of a ghost point.

8. The method of claim 6 further comprising detecting, by the control device, a location of at least one of the ghost points on the touch screen panel based on the sensing of the sensor pairs.

9. The method of claim 6, wherein the sensing of the touch screen panel includes identifying capacitance values for each row and each column, and the identifying of the rows and columns that correspond to the presence of the multiple objects includes identifying the rows and columns based on the capacitance values.

10. The method of claim 6, wherein the sensing of the sensor pairs includes identifying a capacitance value for each sensed sensor pair, and wherein the locations of the multiple objects relative to the touch screen panel are detected based on magnitudes of the capacitance values of the sensed sensor pairs.

11. The method of claim 10, wherein a sensor pair corresponding to a ghost point on the touch screen panel has a larger capacitance than one of the locations of the multiple objects relative to the touch screen panel.

12. A method comprising:
detecting a presence of multiple objects proximate to a sensing matrix of a touch screen panel that includes a plurality of rows and a plurality of columns in response to a first sensing of a respective self-capacitance of each of the plurality of rows and each of the plurality of columns of the touch screen panel;
electrically coupling, by a control device, a first row corresponding to one of the multiple objects in parallel with a first column corresponding to one of the multiple objects to generate a first row-column pair;
performing a second sensing to compute a first magnitude of combined self-capacitance of the first row-column pair to determine whether one of the multiple objects corresponds to the intersection of the first row and the first column;
electrically coupling, by the control device, a second row corresponding to one of the multiple objects in parallel with a second column corresponding to one of the multiple objects to generate a second row-column pair; and
performing a third sensing to compute a second magnitude of combined self-capacitance of the second row-column pair to determine whether one of the multiple objects corresponds to the intersection of the second row and the second column.

13. The method of claim 12, wherein the multiple objects correspond to an object in contact with or proximate to the touch screen panel.

14. The method of claim 12 further comprising selecting the second row and the second column based, at least in part, on results of the first sensing and the second sensing.

15. The method of claim 12, wherein detecting the presence of multiple objects proximate to the touch screen panel further comprises:
electrically coupling rows and columns into a plurality of row-column pairs; and
performing a diagonal scan of the touch screen panel with the plurality of row-column pairs, wherein a magnitude of combined self-capacitance of each row and each column in the touch screen panel is represented in the diagonal scan.

16. The method of claim 12, wherein electrically coupling the first row in parallel with the first column further comprises orthogonally multiplexing the first row with the first column.

* * * * *